US007365972B2

(12) United States Patent
Chen et al.

(10) Patent No.: US 7,365,972 B2
(45) Date of Patent: Apr. 29, 2008

(54) ELECTRONIC DEVICE WITH DUAL HEAT DISSIPATING STRUCTURES

(75) Inventors: Tsu-Cheng Chen, Taoyuan Hsien (TW); Kai-Hung Huang, Taoyuan Hsien (TW); Yi-Hwa Hsieh, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 49 days.

(21) Appl. No.: 11/411,668

(22) Filed: Apr. 26, 2006

(65) Prior Publication Data

US 2007/0115643 A1 May 24, 2007

(30) Foreign Application Priority Data

Nov. 21, 2005 (TW) ................ 94140841 A

(51) Int. Cl.
*H05K 7/20* (2006.01)
(52) U.S. Cl. ................ 361/686; 361/719; 361/720; 165/80.2; 165/80.3; 165/104.33; 165/185; 174/16.3; 174/252
(58) Field of Classification Search ............. 361/687, 361/695, 700, 702, 704–722, 724–727, 742, 361/740, 744, 752–754, 756, 759; 29/830, 29/832, 890.03; 257/691, 706–727; 174/16.3, 174/252; 165/80.2, 80.3, 185, 104.33
See application file for complete search history.

(56) References Cited

U.S. PATENT DOCUMENTS 5,396,403 A * 3/1995 Patel ................ 361/705

| | | | | |
|---|---|---|---|---|
| 5,990,550 A * | 11/1999 | Umezawa | ................ | 257/712 |
| 6,008,987 A * | 12/1999 | Gale et al. | ................ | 361/700 |
| 6,452,366 B1 * | 9/2002 | Hwang | ................ | 323/225 |
| 6,937,474 B2 * | 8/2005 | Lee | ................ | 361/715 |
| 7,019,974 B2 * | 3/2006 | Lee et al. | ................ | 361/700 |
| 7,145,774 B2 * | 12/2006 | Campini et al. | ................ | 361/719 |
| 7,209,356 B2 * | 4/2007 | Lee et al. | ................ | 361/719 |

FOREIGN PATENT DOCUMENTS

JP     403187251 A  *  8/1991
JP     407007109 A  *  1/1995

* cited by examiner

*Primary Examiner*—Michael Datskovskiy

(57) ABSTRACT

An electronic device with dual heat dissipating structures use in an electronic system is disclosed. The electronic device comprises the circuit board having the first and second heat producing surfaces, the major and auxiliary heat dissipating structures disposed on the first and second heat producing surfaces of the circuit board respectively, and the connective portion connecting the auxiliary heat dissipating structure and the major heat dissipating structure. The second heat producing surface of the circuit board is a high-temperatured area relative to the first heat producing surface of the circuit board in the electronic system, thereby the heat produced by the second heat producing surface of the circuit board can be conducted to the major heat dissipating structure through the auxiliary heat dissipating structure and the connective portion for heat dissipation.

18 Claims, 3 Drawing Sheets

ELECTRONIC DEVICE WITH DUAL HEAT DISSIPATING STRUCTURES

FIELD OF THE INVENTION

The present invention relates to an electronic device and more particularly to the electronic device with dual heat dissipating structures.

BACKGROUND OF THE INVENTION

With the progress of the technology, the driving efficiency of the electronic device is raised up. For increasing the driving power, accelerating the driving speed, and conforming to the trend of miniaturization, the volume of the electronic device is reduced and the design of the inner structure is compacted. Therefore the circuit board of the electronic device, such as the power converter, is designed as a double-layer circuit board or multi-layer circuit board, and the electronic elements are placed on both sides of the circuit board for saving space.

Generally speaking, the electronic elements on the circuit board, such as capacitor, transistor, resistor, inductor, transformer, and diode, are high-power heat producing elements. Hence a lot of heat is produced on both sides of the circuit board while these electronic elements are working. The stability of the electronic device depends on the heat dissipating efficiency thereof; however, for satisfying the circuit layout in a finite space, the space for disposing the heat dissipating structure is limited.

Take the power converter for example; with the improvement of the semiconductor and packaging technology and the mass usage of high frequency switch, the power conversion efficiency and the driving efficiency of the power converter are both raised up than ever. Nevertheless, if the heat produced by the high-power electronic elements on both sides of the circuit board cannot be dissipated efficiently, the function and the lifespan of the power converter will be seriously affected. Furthermore, the overheated power converter might become out of order. For dealing with the problem, the heat sink is used to assist heat dissipation.

However, as the foregoing descriptions, with the trend of miniaturization of the electronic device, the space reserved for the heat sink is limited; hence the heat sink can be disposed only on one side of the double-layer circuit board or multi-layer circuit board of the power converter. When the power converter is assembled on the system circuit board of the electronic system or fixed on other object, an air gap is formed between the side of the circuit board without the heat sink and the system circuit board (or the object). It is to be understood that the heat dissipation is hindered because of the air gap; therefore the electronic elements on the circuit board might be damaged owing to the heat accumulation. The damaged electronic elements may affect the stability of the power converter and further cause the shutdown of the electronic system. Moreover, no matter the active or passive cooling method is used in the electronic system, the heat accumulated in the air gap cannot be dissipated actively because the space for air flow is limited and thus a dead space for heat dissipation is formed.

Therefore, it is necessary to develop an electronic device with dual heat dissipating structures to dissipate the heat from both sides of the double or multi layer circuit board efficiently in a limited space for dealing with the foregoing defects.

SUMMARY OF THE INVENTION

An object of the present invention is to provide an electronic device with a major heat dissipating structure and an auxiliary heat dissipating structure disposed on the first and second heat producing surfaces of the electronic device respectively, wherein the first heat producing surface is located at a better heat dissipating surrounding relative to the second heat producing surface. Therefore the heat produced by the second heat producing surface can be conducted through the auxiliary heat dissipating structure and a connective portion to the major heat dissipating structure for assisting heat dissipation, so as to avoid the damage of the electronic elements caused by the heat accumulated near the second heat producing surface. Besides, the heat dissipation efficiency can be raised up without increasing the volume of the electronic device for catering to the miniaturization trend of the electronic device.

According to an aspect of the present invention, there is provided an electronic device with dual heat dissipating structures. The electronic device comprises a circuit board having a first heat producing surface and a second heat producing surface; a major heat dissipating structure disposed on the first heat producing surface of the circuit board; an auxiliary heat dissipating structure disposed on the second heat producing surface of the circuit board; and a connective portion connecting the auxiliary heat dissipating structure and the major heat dissipating structure, wherein the second heat producing surface of the circuit board is also a high-temperatured area relative to the first heat producing surface of the circuit board in an electronic system so as to conduct heat produced by the second heat producing surface of the circuit board to the major heat dissipating structure through the auxiliary heat dissipating structure and the connective portion for heat dissipation.

In an embodiment, the electronic device is a power converter.

In an embodiment, the circuit board is a double-layer circuit board or a multi-layer circuit board.

In an embodiment, the major heat dissipating structure is a heat sink and the auxiliary heat dissipating structure is a plate of high thermal-conductive material made of copper or aluminum.

In an embodiment, the circuit board further comprises a plurality of protrusions disposed on the first heat producing surface and the second heat producing surface respectively.

In an embodiment, the major heat dissipating structure and the auxiliary heat dissipating structure further comprise a plurality of via holes corresponding to the protrusions respectively for the protrusions to pass therethrough.

In an embodiment, the electronic device is fixed on a system circuit board of the electronic system by connecting the protrusions on the second heat producing surface of the circuit board to the system circuit board thereby forming the high-temperatured area between the second heat producing surface of the circuit board and the system circuit board of the electronic system.

In an embodiment, the electronic device further comprises a thermal conducting media disposed between the major heat dissipating structure and the first heat producing surface of the circuit board and/or between the auxiliary heat dissipating structure and the second heat producing surface of the circuit board for conducting heat evenly.

In an embodiment, the major heat dissipating structure is fixed on the first heat producing surface of the circuit board through a fixing element.

In an embodiment, the connective portion is disposed on opposite sides of the auxiliary heat dissipating structure and integrally formed therewith.

In an embodiment, the connective portion is fixed on the major heat dissipating structure through a fixing element.

According to another aspect of the present invention, there is provided an electronic system. The electronic system comprises a system circuit board and an electronic device with dual heat dissipating structures disposed on the system circuit board. The electronic device comprises a circuit board having a first heat producing surface and a second heat producing surface; a major heat dissipating structure disposed on the first heat producing surface of the circuit board; an auxiliary heat dissipating structure disposed on the second heat producing surface of the circuit board and substantially near the system circuit board; and a connective portion extended from opposite sides of the auxiliary heat dissipating structure and connected to the major heat dissipating structure; wherein heat produced by the second heat producing surface is conducted to the major heat dissipating structure through the auxiliary heat dissipating structure and the connective portion so as to dissipate heat.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The electronic device of the present invention is applied to an electronic system with a system circuit board, such as the power supply system of a liquid crystal display. The electronic device can be a power converter, preferably a DC/DC converter, but not limited thereto. In other words, any electronic device having a circuit board, both sides of which produce heat and need to be heat dissipated, can be included within the spirit of the present invention.

Figure 1:
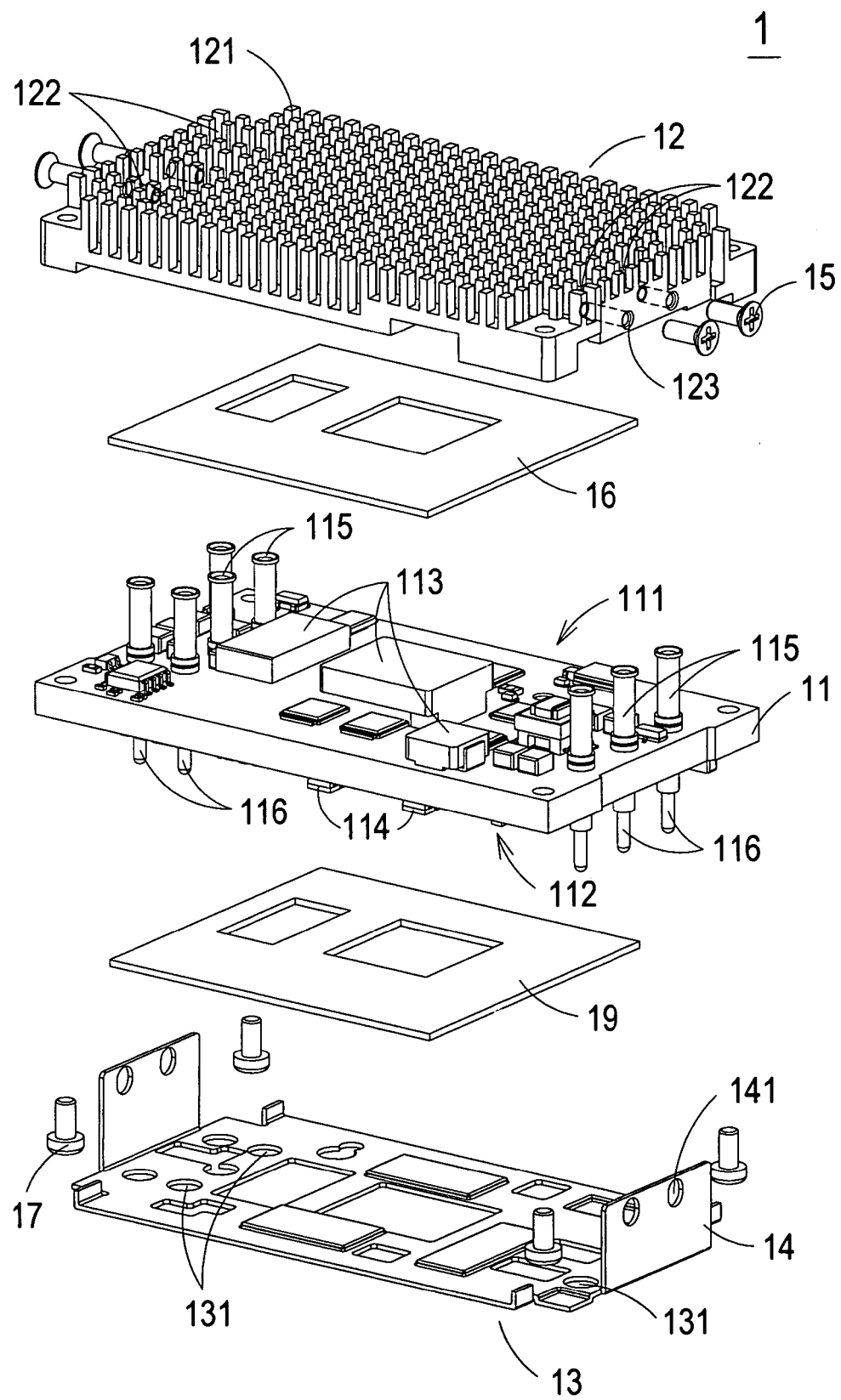
FIG. 1 is a schematic diagram showing the disassembled structure of the electronic device with dual heat dissipating structures according to the preferred embodiment of the present invention.

Please refer to FIG. 1, which is a schematic diagram showing the disassembled structure of the electronic device with dual heat dissipating structures according to the preferred embodiment of the present invention. As shown in FIG. 1, the electronic device 1 comprises a circuit board 11, a major heat dissipating structure 12, an auxiliary heat dissipating structure 13, a connective portion 14, and a plurality of fixing elements 15 and 17. In this embodiment, the circuit board 11 of the electronic device 1 is a printed circuit board and preferably a double-layer circuit board or multi-layer circuit board, but not limited thereto. The circuit board 11 has a first heat producing surface 111 and a second heat producing surface 112 at two opposite sides thereof. The plural heat producing electronic elements 113 and 114, such as capacitor, transistor, transformer, resistor, and inductor, are disposed on the first heat producing surface 111 and the second heat producing surface 112 respectively. Hence a lot of heat is produced by the heat producing electronic elements 113 and 114 while the electronic device 1 is working.

The circuit board 11 further comprises a plurality of protrusions 115 and 116 perpendicularly extending outward from the first heat producing surface 111 and the second heat producing surface 112 respectively. The protrusions 115 and 116 are made of conductive materials such as metal for connecting to other electronic equipments. For example, as shown in FIG. 2, the protrusions 116 on the second heat producing surface 112 are functioned as the pins for connecting to the system circuit board 18 of the electronic system, such as the system circuit board of the power supply system, therefore the circuit board 11 of the electronic device 1 is electrically connected to the system circuit board 18 through the protrusions 116.

The major heat dissipating structure 12 is disposed on the first heat producing surface 111 of the circuit board 11. In this embodiment, the major heat dissipating structure 12, such as a heat sink, comprises a plurality of projections 121 extended from one side thereof for increasing the heat dissipating area. The other side of the major heat dissipating structure 12 opposite to the projections 121 is contacted with the first heat producing surface 111 of the circuit board 11. Besides, the major heat dissipating structure 12 further comprises a plurality of via holes 122 corresponding to the protrusions 115 on the first heat producing surface 111 of the circuit board 11. The area of the via holes 122 is substantially larger than the cross section of the protrusions 115 on the first heat producing surface 111, so as to avoid the connection between the protrusions 115 and the major heat dissipating structure 12 and isolate the major heat dissipating structure 12, while the protrusions 115 penetrate through the via holes 122.

Figure 2:
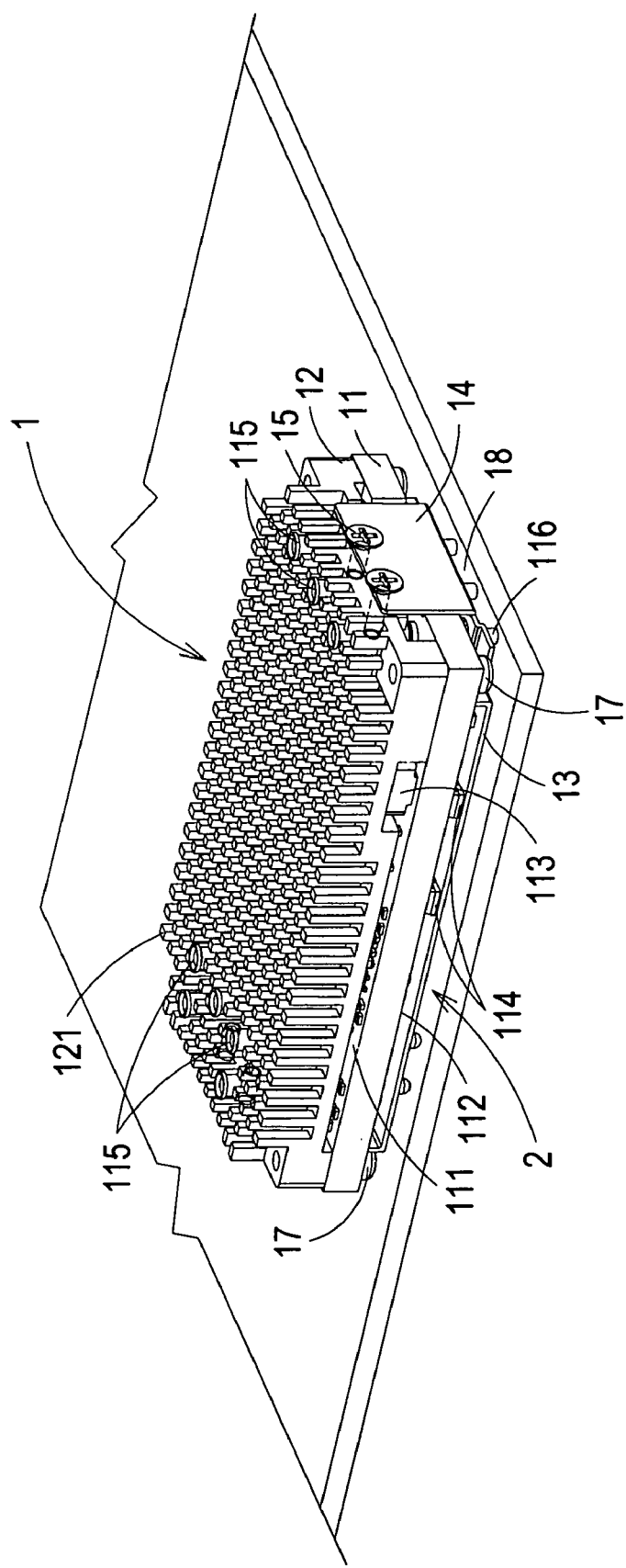
FIG. 2 is a schematic diagram showing the electronic device with dual heat dissipating structures disposed on a system circuit board of an electronic system according to the preferred embodiment of the present invention.

Please refer to FIG. 2, which is a schematic diagram showing the electronic device with dual heat dissipating structures disposed on a system circuit board of an electronic system according to the preferred embodiment of the present invention. As shown in FIG. 2, the electronic device 1 is disposed on the system circuit board 18 through the protrusions 116 on the second heat producing surface 112 connecting to the system circuit board 18 by soldering or insertion. Therefore an air gap is formed between the second heat producing surface 112 of the circuit board 11 and the system circuit board 18. The air circulation in the air gap is constricted owing to the limited space and thus makes the air gap become a high-temperatured area. In other words, no matter an active cooling method or a passive cooling method is used in the electronic system, the second heat producing surface 112 of the circuit board 11 is a high-temperatured area relative to the first heat producing surface 111. For assisting heat dissipation from the heat producing electronic elements 114 on the second heat producing surface 112, an auxiliary heat dissipating structure 13 is disposed on the second heat producing surface 112 of the circuit board 11.

Figure 3:
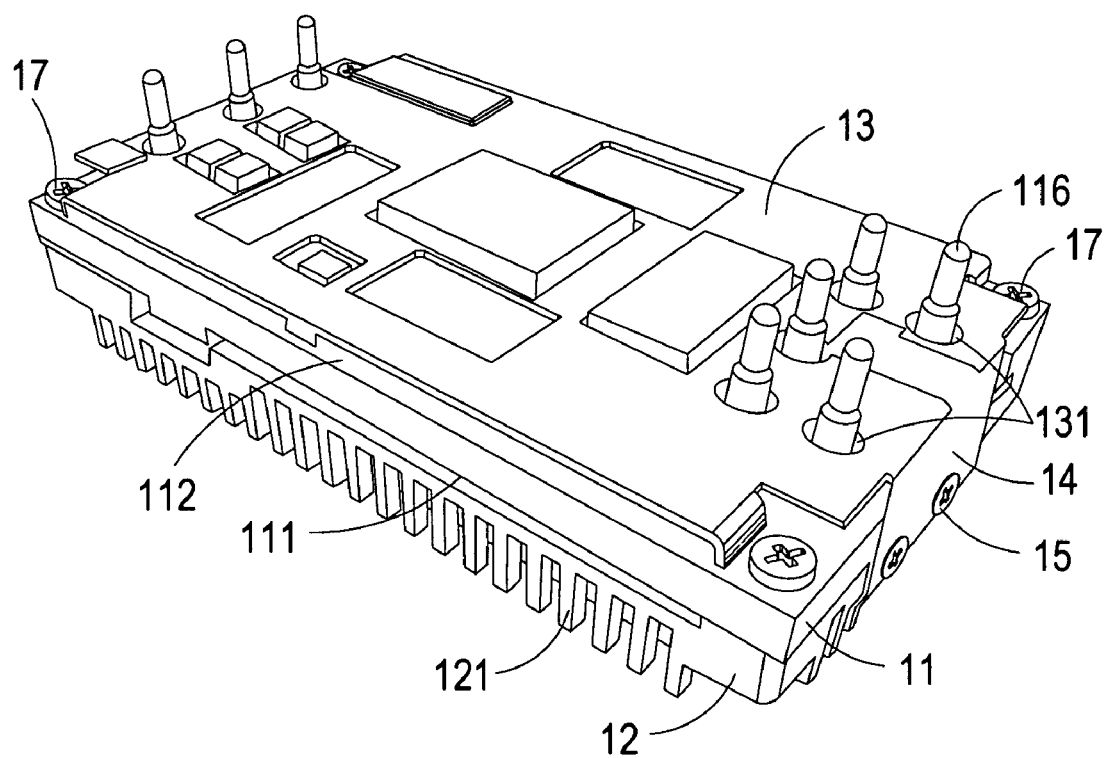
FIG. 3 is a schematic diagram showing the electronic device with dual heat dissipating structures of the auxiliary heat dissipating structure side according to the preferred embodiment of the present invention.

Please refer to FIG. 1 and cooperate with FIG. 3, the auxiliary heat dissipating structure 13 is a thin plate made of a high thermal-conductive material, for example a metal plate made of copper or aluminum, but not limited thereto. Similarly, for avoiding the current being conducted to the auxiliary heat dissipating structure 13 through the protrusions 116, the auxiliary heat dissipating structure 13 further comprises a plurality of via holes 131 corresponding to the protrusions 116 on the second heat producing surface 112 of the circuit board 11. The area of the via holes 131 is substantially larger than the cross section of the protrusions 116 on the second heat producing surface 112, hence the connection between the auxiliary heat dissipating structure 13 and the protrusions 116 is avoided and the auxiliary heat dissipating structure 13 is isolated while the electronic device 1 is electrically connected to the system circuit board 18 through the protrusions 116.

Please refer to FIG. 1 and cooperate with FIG. 3 again, a plurality of fixing elements 17 such as screws are used for positioning and fixing the major heat dissipating structure 12 on the first heat producing surface 111 of the circuit board 11. Meanwhile, the auxiliary heat dissipating structure 13 is fixed on the electronic device 1 indirectly through the connective portion 14 connected and fixed to the major heat dissipating structure 12. In this embodiment, the connective portion 14 is extended from two opposite sides of the auxiliary heat dissipating structure 13 and integrally formed therewith. The included angle between the connective portion 14 and the auxiliary heat dissipating structure 13 is substantially 90°, therefore the connective portion 14 is extended from the auxiliary heat dissipating structure 13 toward the corresponding opposite sides of the major heat dissipating structure 12 and contacted therewith. Thus the auxiliary heat dissipating structure 13 can be linked to the major heat dissipating structure 12 through the connective portion 14.

Moreover, the connective portion 14 further includes the openings 141 corresponding to the holes 123 on the opposite sides of the major heat dissipating structure 12. While the major heat dissipating structure 12 and the auxiliary heat dissipating structure 13 are assembled to the circuit board 11 of the electronic device 1, the protrusions 115 and 116 are penetrated through the via holes 122 and 131 on the major heat dissipating structure 12 and auxiliary heat dissipating structure 13 respectively. In the mean time, the openings 141 on the connective portion 14 are aligned with the holes 123 on the major heat dissipating structure 12. The auxiliary heat dissipating structure 13 is fixed to the major heat dissipating structure 12 through the fixing elements 15, such as screws, penetrating through the openings 141 on the connective portion 14 and the holes 123 on the major heat dissipating structure 12 as shown in FIGS. 2 and 3. Hence the heat produced by the heat producing electronic elements 114 on the second heat producing surface 112 can be conducted to the major heat dissipating structure 12 through the auxiliary heat dissipating structure 13 and the connective portion 14 in order for heat dissipation.

To dissipate the heat of the circuit board 11 produced by the heat producing electronic elements 113 on the first heat producing surface 111 through the major heat dissipating structure 12 evenly and efficiently, a first thermal conducting media 16 is disposed between the major heat dissipating structure 12 and the first heat producing surface 111 of the circuit board 11. The first thermal conducting media 16 can be a thermal pad, thermal grease, or thermal glue, but not limited thereto. Therefore the heat produced by the heat producing electronic elements 113 on the first heat producing surface 111 can be conducted to the major heat dissipating structure 12 evenly via the first thermal conducting media 16.

Of course, a second thermal conducting media 19 can be disposed between the auxiliary heat dissipating structure 13 and the second heat producing surface 112 as well, hence the heat produced by the heat producing electronic elements 114 on the second heat producing surface 112 can be conducted to the auxiliary heat dissipating structure 13 evenly through the second thermal conducting media 19, and then conducted to the major heat dissipating structure 12 through the connective portion 14 to be further dissipated.

While the electronic device 1 is working, a lot of heat is produced by the heat producing electronic elements 113 and 114 on the first heat producing surface 111 and the second heat producing surface 112. The heat of the first heat producing surface 111 can be conducted to the major heat dissipating structure 12 through the first thermal conducting media 16 and dissipated to the inner space of the electronic system. Because the first heat producing surface 111 is located at a low-temperatured area relative to the second heat producing surface 112, for example a better surrounding for heat dissipation as shown in FIG. 2, the heat of the first heat producing surface 111 can be dissipated by the major heat dissipating structure 12 and then removed by the active or passive cooling method used in the electronic system quickly.

Moreover, though the second heat producing surface 112 is located at a high-temperatured area relative to the first heat producing surface 111, for example a worse surrounding for heat dissipation like the air gap 2 shown in FIG. 2, the heat produced by the heat producing electronic elements 114 on the second heat producing surface 112 can be dispersed and conducted to the auxiliary heat dissipating structure 13 evenly through the second thermal conducting media 19. Then the heat is conducted to the major heat dissipating structure 12 through the connective portion 14 and finally dissipated to the inner space of the electronic system and removed by the active or passive cooling method used in the electronic system so as to assist heat dissipation. Besides, partial of the heat on the second heat producing surface 112 can be dissipated by the auxiliary heat dissipating structure 13 directly because the auxiliary heat dissipating structure 13 is made of a high thermal-conductive material. Hence the condition of uneven heat dissipation of the first heat producing surface 111 and the second heat producing surface 112 of the circuit board 11 can be avoided while the electronic device 1 is working.

Of course, the electronic device of the present invention can be not only fixed on the system circuit board horizontally as shown in FIG. 2, but also fixed perpendicularly to other objects such as a circuit board other than the system circuit board. In other words, if the electronic device having heat produced by both sides of the circuit board with uneven heat dissipation efficiency, the major heat dissipating structure can be disposed on the surface of the circuit board located at the low-temperatured area and the auxiliary heat dissipating structure can be disposed on the other surface of the circuit board located at the high-temperatured area. Thus, via the heat conduction path to the major heat dissipating structure provided by the auxiliary heat dissipating structure and the connective portion, the heat dissipation efficiency of the surface of the circuit board located at the high-temperatured area can be improved.

To sum up, the electronic device with dual heat dissipating structures has the major heat dissipating structure disposed on the first heat producing surface located at a low-temperature area and the auxiliary heat dissipating structure disposed on the second heat producing surface located at a high-temperatured area relative to the first heat producing surface. Therefore the heat of the second heat producing surface of the circuit board can be conducted to the major heat dissipating structure through the auxiliary heat dissipating structure and the connective portion in order, so as to assist heat dissipation and deal with the uneven heat dissipation problem of two sides of the circuit board of the electronic device without increasing the volume of the electronic device. In addition, the electronic device with the auxiliary heat dissipating structure is neater than the conventional electronic device because some of the electronic elements are covered thereunder.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with dual heat dissipating structures, comprising:
    a circuit board having a first heat producing surface and a second heat producing surface with a plurality of protrusions disposed on said first and said second heat producing surfaces respectively;
    a major heat dissipating structure disposed on said first heat producing surface of said circuit board;
    an auxiliary heat dissipating structure disposed on said second heat producing surface of said circuit board; and
    a connective portion connecting said auxiliary heat dissipating structure and said major heat dissipating structure;
    wherein said second heat producing surface of said circuit board is a high-temperatured area relative to said first heat producing surface of said circuit board in an electronic system so as to conduct heat produced by said second heat producing surface of said circuit board to said major heat dissipating structure through said auxiliary heat dissipating structure and said connective portion for heat dissipation.

2. The electronic device with dual heat dissipating structures according to claim 1 wherein said electronic device is a power converter.

3. The electronic device with dual heat dissipating structures according to claim 1 wherein said circuit board is a double-layer circuit board or a multi-layer circuit board.

4. The electronic device with dual heat dissipating structures according to claim 1 wherein said major heat dissipating structure is a heat sink.

5. The electronic device with dual heat dissipating structures according to claim 1 wherein said auxiliary heat dissipating structure is a plate made of a high thermal-conductive material.

6. The electronic device with dual heat dissipating structures according to claim 5 wherein said high thermal-conductive material is metal.

7. The electronic device with dual heat dissipating structures according to claim 1 wherein said major heat dissipating structure and said auxiliary heat dissipating structure further comprise a plurality of via holes corresponding to said protrusions respectively for said protrusions to pass therethrough.

8. The electronic device with dual heat dissipating structures according to claim 1 wherein said electronic device is fixed on a system circuit board of said electronic system by connecting said protrusions on said second heat producing surface of said circuit board to said system circuit board thereby forming said high-temperatured area between said second heat producing surface of said circuit board and said system circuit board of said electronic system.

9. The electronic device with dual heat dissipating structures according to claim 1 wherein said electronic device further comprises a thermal conducting media disposed between said major heat dissipating structure and said first heat producing surface of said circuit board and/or between said auxiliary heat dissipating structure and said second heat producing surface of said circuit board for conducting heat evenly.

10. The electronic device with dual heat dissipating structures according to claim 1 wherein said major heat dissipating structure is fixed on said first heat producing surface of said circuit board through a fixing element.

11. The electronic device with dual heat dissipating structures according to claim 1 wherein said connective portion is disposed on opposite sides of said auxiliary heat dissipating structure and integrally formed therewith.

12. The electronic device with dual heat dissipating structures according to claim 11 wherein said connective portion is fixed on said major heat dissipating structure through a fixing element.

13. An electronic system comprising:
    a system circuit board; and
    an electronic device with dual heat dissipating structures disposed on said system circuit board, said electronic device comprising:
    a circuit board having a first heat producing surface and a second heat producing surface with a plurality of protrusions disposed on said first and said second heat producing surfaces respectively;
    a major heat dissipating structure disposed on said first heat producing surface of said circuit board;
    an auxiliary heat dissipating structure disposed on said second heat producing surface of said circuit board and substantially near said system circuit board; and
    a connective portion extended from opposite sides of said auxiliary heat dissipating structure and connected to said major heat dissipating structure;
    wherein heat produced by said second heat producing surface is conducted to said major heat dissipating structure through said auxiliary heat dissipating structure and said connective portion so as to dissipate heat.

14. The electronic system according to claim 13 wherein said electronic device is a power converter.

15. The electronic system according to claim 13 wherein said major heat dissipating structure is a heat sink.

16. The electronic system according to claim 13 wherein said auxiliary heat dissipating structure is a plate made of high thermal-conductive material.

17. The electronic system according to claim 13 wherein said major heat dissipating structure and said auxiliary heat dissipating structure further comprise a plurality of via holes corresponding to said protrusions respectively for said protrusions to pass therethrough.

18. The electronic system according to claim 13 wherein said electronic device is fixed on said electronic system by connecting said protrusions on said second heat producing surface of said circuit board to said system circuit board thereby forming a high-temperatured between said second heat producing surface of said circuit board and said system circuit board.

* * * * *